United States Patent [19]

Sara

[11] 4,145,135

[45] Mar. 20, 1979

[54] LITHOGRAPHIC PLATE PROCESSOR

[75] Inventor: George M. Sara, Garden Grove, Calif.

[73] Assignee: Beach Manufacturing Corporation, Huntington Beach, Calif.

[21] Appl. No.: 829,645

[22] Filed: Sep. 1, 1977

[51] Int. Cl.² ............................................. G03D 3/10
[52] U.S. Cl. .................................. 354/317; 354/324; 251/63; 222/330
[58] Field of Search ............... 354/317, 318, 324, 325; 137/869, 883; 251/63, 63.5, 145; 222/330, 485

[56] References Cited

U.S. PATENT DOCUMENTS

| | | | |
|---|---|---|---|
| 3,332,580 | 7/1967 | Spencer et al. | 222/485 X |
| 3,593,641 | 7/1971 | Adams et al. | 354/317 |
| 3,608,464 | 9/1971 | Harrelli et al. | 354/317 |
| 3,682,078 | 8/1972 | Parker et al. | 354/317 |
| 3,752,054 | 8/1973 | Scanlan | 354/317 |
| 4,081,577 | 3/1978 | Horner | 354/325 |

Primary Examiner—L. T. Hix
Assistant Examiner—Alan Mathews
Attorney, Agent, or Firm—Fulwider, Patton, Rieber, Lee & Utecht

[57] ABSTRACT

Method and apparatus for processing lithographic plate which includes two sprayer/scrubber stations separated by a water rinse. The fluids to be sprayed are continuously circulated through fluid feed tubes provided with externally actuable metering orifices. The valve operators for the orifices are pneumatically operated in a periodic manner to provide even dispersion of the fluid.

9 Claims, 7 Drawing Figures

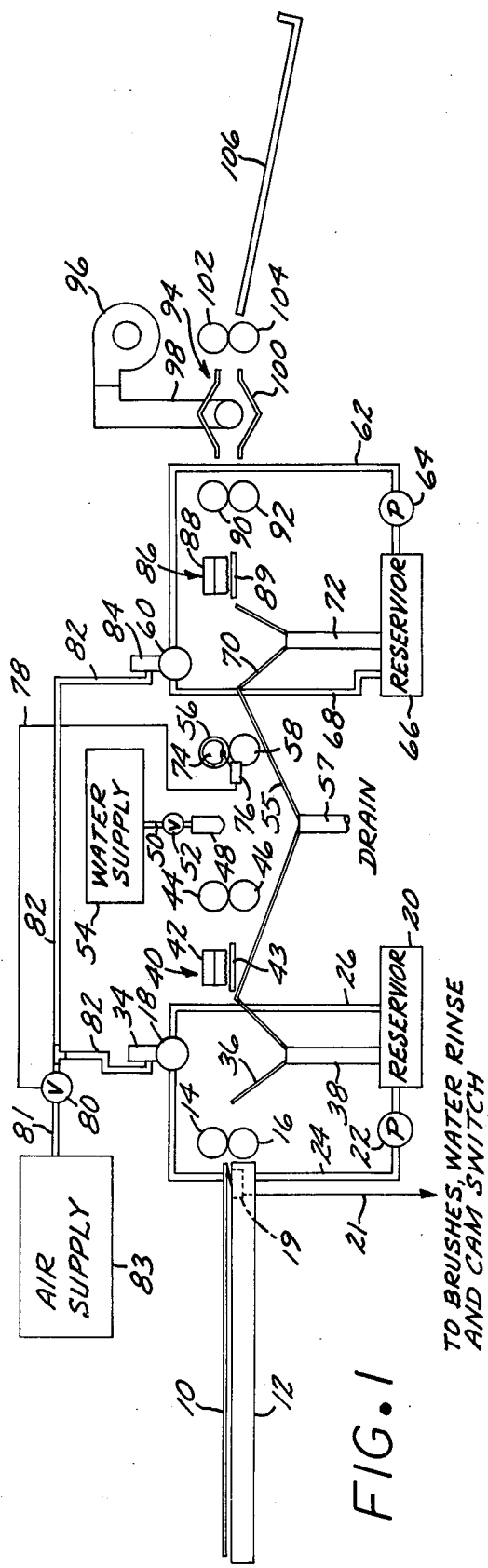
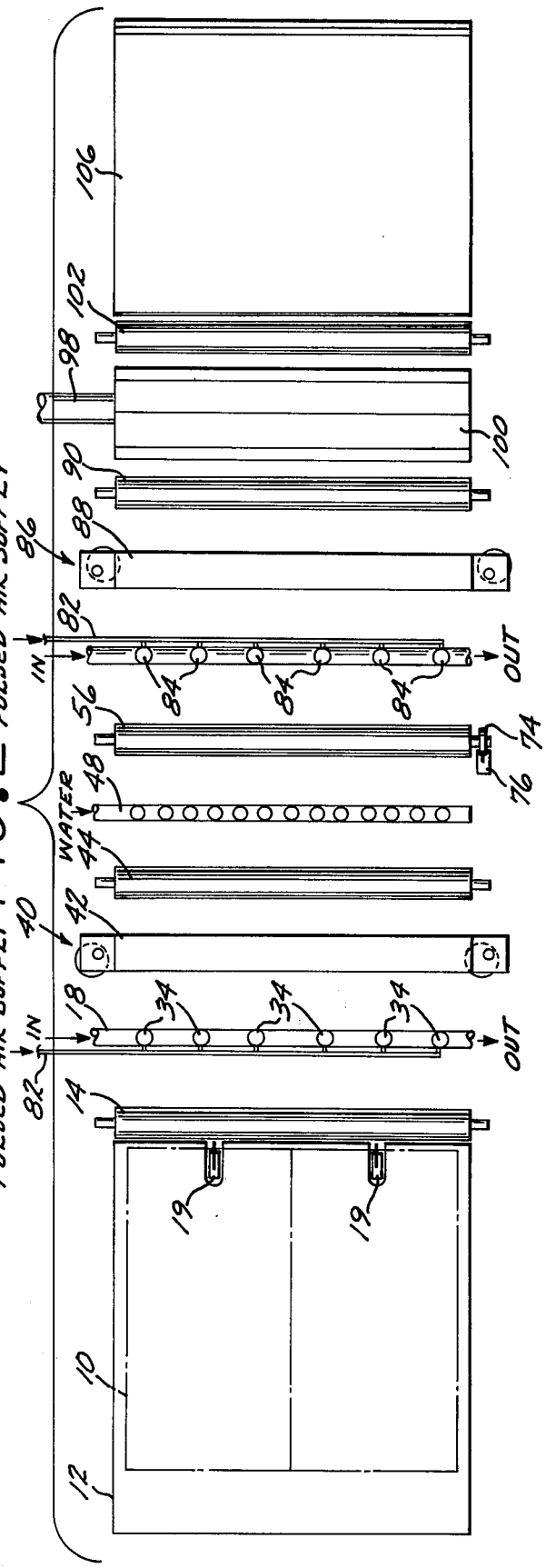

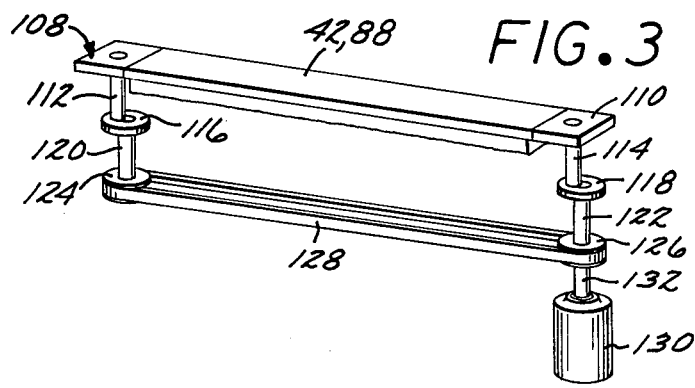
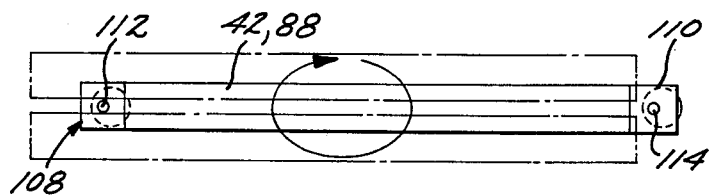
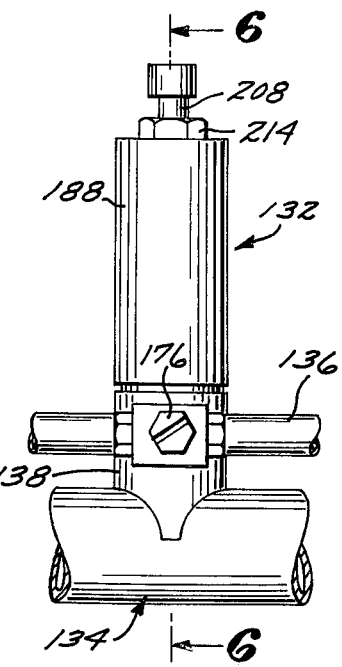
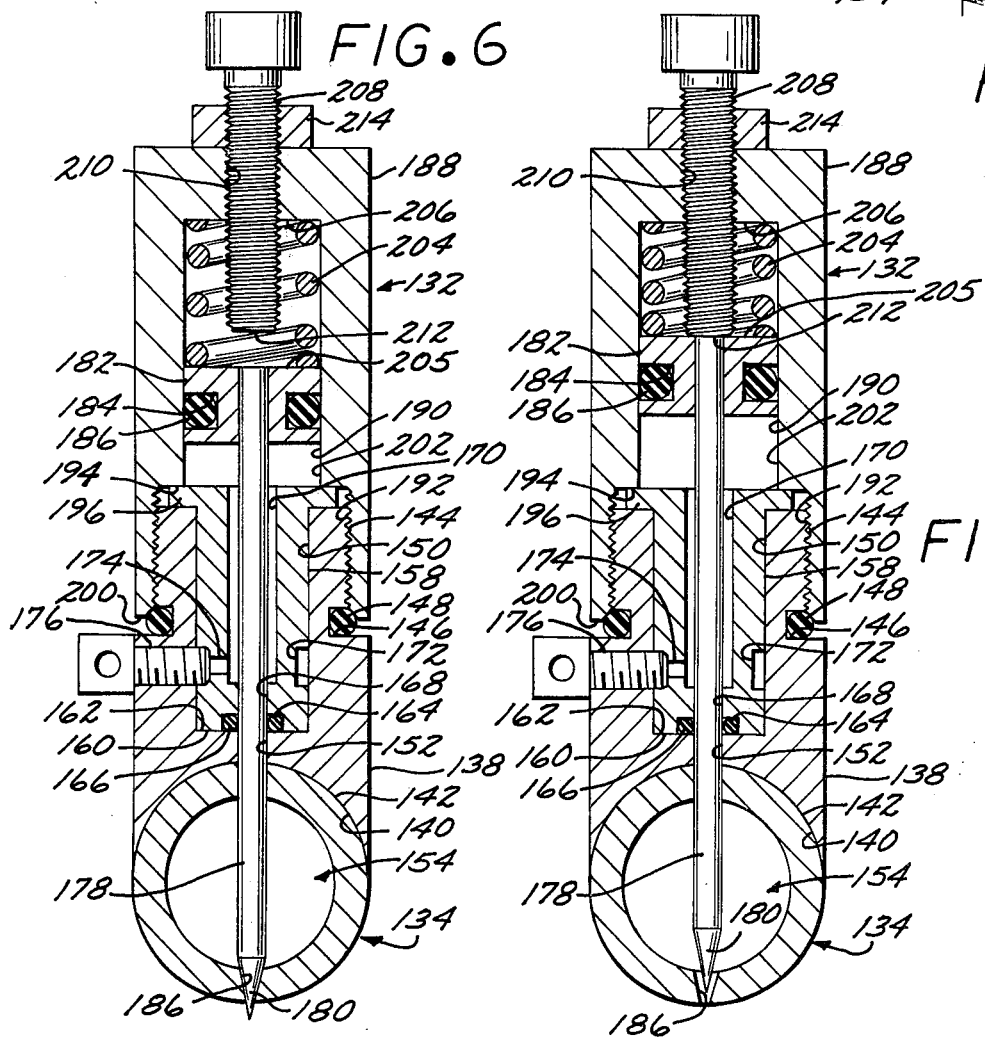

LITHOGRAPHIC PLATE PROCESSOR

BACKGROUND OF THE INVENTION

1. Field of the Invention

The present invention relates generally to lithographic plate processing techniques and more particularly to a metered, periodically actuated fluid spray for use in such a processor.

2. Description of the Prior Art

In conventional lithographic plate processing techniques, fluids are generally brushed or rubbed into the plate to insure an even distribution and effectiveness of the fluids. The excess fluid is then typically removed from the plate by passing it through a series of squeeze rollers and the plate is eventually dried with hot air.

Typical fluid dispensing and brushing apparatus are illustrated in U.S. Pat. No. 3,608,464 to Harrell et al. and U.S. Pat. No. 3,682,078 to Parker et al. In these patents, the fluid to be dispensed is pumped from a reservoir in through a solenoid valve directly onto the brushing area. Since the fluid is dispersed through the brushes themselves, a straight through fluid flow is utilized. However, due to the character of the fluids which must be used in lithographic plate processing, the direct application of the fluid to the brushes is not always satisfactory. Fluid suspension may be disrupted due to the filtering action of the brushes. Therefore, for some types of fluid, it is more advantageous to apply the fluid directly to the plate prior to brushing or rubbing it into the surface of the plate. Thus, there has been a need for a technique for maintaining the fluid in the proper suspension and properly dispensing it onto a lithographic plate prior to rubbing or brushing it into the surface. The present invention satisfies that need.

SUMMARY OF THE INVENTION

The lithographic plate processing technique of the present invention provides a fluid dispensing station in which the fluid to be dispensed is continuously maintained in proper suspension and selectively dispensed in a manner which maintains that suspension and provides an even coating of the lithographic plate prior to the scrubbing operation. Thus, lithographic plates processed with the technique provided by the invention have more uniform characteristics resulting in higher quality lithographic printing.

The fluid dispensing apparatus of the invention includes a fluid feed tube in which a fluid is maintained in continuous flow by means of a reservoir and pump. The feed tube is provided with a plurality of metering orifices normally closed by valve members externally connected to pistons slidably mounted within piston chambers. The pistons are normally spring biased in a direction to close said orifices and are movable to open said orifices under pneumatic pressure within the piston chambers. The pneumatic operation of the metering orifices is preferably done in a periodic manner to maintain the agitation in the suspension fluid and to evenly disperse thw fluid over the lithographic plate. The piston is limited in its pneumatic movement within the piston chamber by means of a metering screw mounted concentric with the biasing spring and against which the piston abuts when it is at the end of its desired limited movement.

In an illustrated use two spraying and scrubbing stations are provided which are separated by a water rinsing station. In this way, two different types of fluid, such as an asphaltum-gum-etch solution, may be applied at one station and a gum arabic solution may be applied to the plate at another station in a developing process prior to passing the plate through the hot air drying station. The scrubbers provided are elongated brush members, the ends of which are eccentrically mounted for movement in a substantially rotary manner for even scrubbing action.

These and other features of the present invention will become apparent when considered with the detailed description of the presently preferred embodiment.

BRIEF DESCRIPTION OF THE DRAWINGS

FIG. 1 is a diagrammatic elevational view of the plate processing technique of the invention, showing the succession of processing stations;

FIG. 2 is a diagrammatic plan view of the processing system;

FIG. 3 is a diagrammatic perspective view of the eccentrically mounted and driven scrubbing apparatus;

FIG. 4 is a phantom plan view illustrating the scrubbing action of the apparatus shown in FIG. 3;

FIG. 5 is an enlarged, broken away elevational view of the construction of the actuating means of the fluid dispenser of the invention;

FIG. 6 is an enlarged cross sectional view taken in the direction of lines 6—6 of FIG. 5, illustrating the closed orifice; and FIG. 7 is a view similar to that of FIG. 6 illustrating the opened orifice.

DESCRIPTION OF THE PREFERRED EMBODIMENT

Turning now to the drawings, and particularly FIG. 1 thereof, there is illustrated in diagrammatic form a lithographic plate processor incorporating the features of the invention. In the illustration, a lithographic plate 10 which is ready for processing, moves from a carrier 12 through a pair of squeeze rollers 14 and 16, past a fluid dispensing tube 18, while still being supported by the carrier 12.

In the presently preferred embodiment of the invention, the fluid dispensing tube 18 has a continuous flow of fluid therethrough provided by a fluid reservoir 20 which supplies fluid to a pump 22 which pumps the fluid through a conduit 24 to the dispensing tube with the fluid returning through a conduit 26 to the reservoir 20. The constant circulation of the fluid through the dispensing tube 18 insures that the fluid maintains the proper suspension of particles. The circulation of the fluid in the dispensing tube 18 and rotation of the squeeze rollers is activated by the plate 10 engaging one of a pair of microswitches 19 embedded in the carrier 12 in front of the rollers 14 and 16 which activates the pumps 22 and 64 and the system drive motors (not shown) through a control line 21. A roller 56 carries on one of its ends a cam 74 which activates a suitable cam following device such as a microswitch 76, which periodically activates a solenoid valve 80 in a line 81 from an air supply source 83 by means of a control line 78.

The solenoid valve 80 controls the supply of air through the air conduit 82 to the actuating section 34 of a metering valve to be described below. Thus, conduit 82 is also connected to the actuating sections 84 of another fluid dispensing tube 60 to be described below. Thus, as the plate 10 passes beneath the dispensing tube 18, a periodic spray of processing fluid is sprayed onto the plate. To prevent loss of fluid, a collecting funnel 36 is provided with a drain conduit 38 back to the reservoir 20.

As the plate 10 moves past the dispensing tube 18, it passes to a scrubbing station 40 which includes an upper scrubbing element 42 which is eccentrically mounted at its ends, as shown in FIG. 2, and which provides a rotary scrubbing motion to scrub the emulsion fluid into the top surface of the plate 10. The plate 10 is supported during scrubbing by a backing plate 43 suitably ribbed (not shown) to prevent movement of the plate.

As the plate moves past the scrubbing station 40, it passes between a second pair of squeeze rollers 44 and 46 to remove the excess fluid.

The plate then passes under a water rinse station which includes a water sprayer 48 which is connected through a conduit 50 and valve 52 to a water supply tank 54. A trough 55 and drain 57 are provided to catch the rinse water. The plate 10 is rinsed and then passes through a third pair of squeeze rollers 56 and 58 into a second spraying and scrubbing station which includes the second fluid dispensing tube 60 typically supplied with gum arabic solution through a conduit 62 from a pump 64 connected to reservoir 66. Again, a return conduit 68 is provided between the dispersion tube 60 and the reservoir 66. Again, a collecting funnel 70 catches excess solution as the plate 10 moves past the spraying station and which is connected through a conduit 72 to the reservoir 66. As for the first station, the dispersion of fluid from the tube 60 is controlled by the cam 74 on the squeeze roller 56 as described above. Again, the air pump 80 supplies pneumatic pulses through a conduit 82 to the actuating mechanism 84 of the metering orifice valves, as discussed in detail below.

From the second spraying station, the plate 10 passes again through a scrubbing station 86 including an eccentrically mounted scrubbing element 88 and a backing plate 89. Following the scrubbing, the plate 10 passes through a fourth set of squeeze rollers 90 and 92 to remove the excess solution. The plate 10 then passes through a hot air drying station 94 which includes a blower 96 connected through a duct 98 to an air baffle 100 to circulate the air around the plate. From the air drying station 94, the plate passes through a fifth set of squeeze rollers 102 and 104 to an exit tray 106 where the plates are successively stacked.

FIG. 3 is a diagrammatic perspective view of the eccentric mounting and operation of the scrubbing elements 42 and 88 shown in FIGS. 1 and 2 and FIG. 4 is a phantom view showing the rotary action of the scrubbing element. As can be seen, the ends 108 and 110 of the scrubbing element are rotatably pinned through pins 112 and 114 on the peripheries of crank disks 116 and 118 which have drive shafts 120 and 122 which are commonly rotated by means of pulley wheels 124 and 126 and drive belt 128, the whole being rotated by a drive motor 130 through a drive shaft 132 co-axial with the shaft 122. The shafts 132, 122 and 120 rotate together to cause the rotary positional changes illustrated in FIG. 4.

FIGS. 5, 6 and 7 illustrate the actuating mechanisms (34, 84) and fluid metering orifices utilized in the present invention. In particular, an actuating mechanism 132 is mounted perpendicular to a fluid dispensing tube 134. A pneumatic conduit 136 is connected to each actuating mechanism 132 with pneumatic communication therewith. The actuating mechanism 132 includes a mounting section adapted to be mounted on the dispensing tube 134 by providing a transverse cylindrical surface 140 on one end thereof which mates with the cylindrical surface 142 of the tube. The upper end of the cylindrical mounting section 138 is externally threaded with the lower end of the threaded portion terminating in a rectangular annular groove 146 for receiving a sealing O-ring 148. The upper end 144 of the mounting section 138 also includes an axial bore 150 terminating at its lower end with a smaller diameter valve bore 152 which communicates between the bore 150 and the inside 154 of the tube 134. Diametrically opposite the bore 152 is a metering or fluid dispensing orifice 156 through the wall of the tube 134. The orifice 156 is substantially conically shaped with the apex being external of the wall of the tube 134. The orifice 156 is located in tube 134 diametrically opposite the valve bore 152 in mounting section 138, which also extends through the tube 134.

A cylindrical valve seal fitting 158 is received in the bore 150 and is provided at a lower end 160 which abuts a bottom 162 of the bore 150 with a shallow counterbore 164 which defines with the bottom 162 an annular rectangular recess which is provided with an O ring 166. The fitting 158 has a diametrically reduced bore 168 adjacent the O-ring seal 166 which is the same size as the bore 152 through the wall of the tube 134. The fitting 158 further has a bore 170 open to the top of the fitting. The fitting 158 also has an external annular groove 172 including a radial bore 174 through to the bore 170. Threadably mounted in an axial bore 176 through the mounting section 138 to the annular groove 172 is a pneumatic fitting which can be connected to a source of air pressure.

Axially mounted through the bore 170 in the fitting through the O-ring seal 166 and thence through the tubing 134 is a metering pin 178 terminating at its lower end in a conically shaped metering point 180 which when in contact with the metering orifice 156 closes that orifice. The metering pin 178 by means of O-ring 166 effectively seals the inside 154 of the tubing 134 from the inside of the fitting 158.

Mounted atop the metering pin 178 and fixed to it is a piston 182 which includes on its external periphery an annular rectangular groove 184 containing an O-ring 186. A cap 188 including a bore 190 terminating at its open end in an internally threaded counterbore 192 is adapted to be threadably mounted on the mounting section 138 so that a shoulder 194 defined by the counterbore 192 engages a flange 196 on the upper end of the fitting 158 to lock it in place atop the mounting section 138. The lower open end 200 of the cap 188 engages the O-ring 148 to seal the inside of the piston chamber 202.

A valve closing force for the metering orifice 156 is provided by means of a compression spring 204 fixed in the piston chamber bore 190 between a top surface 206 of the piston 182 and the closed upper end 206 of the bore 190. In the closed valve position, the spring 204 is under compression, which provides the valve closing force. This is the situation illustrated in FIG. 6.

When the valve is opened, air pressure is applied through the pneumatic fitting 176 through the bore 174 into the piston chamber defined by the bore 190 and bore 170. The pneumatic pressure forces the piston 182 up and compresses the spring 204 raising the metering pin 178 to open the metered orifice 156.

Metering is accomplished by means of a metering screw 208 threadably mounted in an internally threaded bore 210 concentric with the piston chamber 190. With the metering screw 208 in position, the piston can rise in the piston chamber 190 only until the end 212 of the screw abuts the top surface 205 of the piston. The metering position of the screw is maintained in place by means of a lock nut 214 on the metering screw 208 on a top surface 216 of the cap 188.

Thus, the metering orifice valve system with its actuating system provides positive metered fluid dispensation while maintaining the fluid in proper suspension and agitation to provide uniform spraying and application of the fluids to the surfaces of a lithographic plate. When combined with he scrubbing apparatus of the invention, a uniform coating is applied to a succession of lithographic plates, resulting in uniform light sensitivity from plate to plate and finally resulting in an overall improved printed product.

While a particular preferred embodiment of the invention has been described in detail, it should be appreciated that many structural variations are possible so that the scope of the invention is not to be limited, except by the following claims.

I claim:

1. In a lithographic plate processor, a fluid feed apparatus comprising:
    a fluid feed tube adapted for substantially continuous fluid feed therethrough, said tube having a plurality of spaced fluid dispensing orifices through a side wall of said tube and corresponding diametrically oppositely located bores therethrough;
    a plurality of fluid metering valve members passing through said bores in said side wall opposite said orifices and movable into fluid metering arrangement with said orifices;
    fluid actuating means operatively connected to said valve members on said side wall opposite said orifices, said actuating means including a piston connected to said valve member and sealingly movable in a piston chamber, said piston being normally spring biased to cause said valve members to close said orifices; and
    pneumatic pressure means connected to said chamber opposite said spring for selectively pneumatically moving said piston and valve member to open said orifices.

2. A fluid feed apparatus as defined in claim 1 including:
    metering means mounted in the spring side of said chamber for controlling movement of said piston and degree of opening of said orifices.

3. A fluid feed apparatus as defined in claim 1 wherein said pneumatic pressure means includes:
    means for periodically actuating the pneumatic pressure applied to said chamber whereby said orifices are periodically opened;

4. A fluid feed apparatus as defined in claim 3 wherein said periodic actuating includes:
    means for periodically interrupting the operation of said actuating means.

5. A fluid dispensing apparatus for use in a lithographic plate processor wherein a plate to be processed is passed beneath said dispensing apparatus, said apparatus comprising:
    a fluid feed tube adapted for continuous fluid flow therethrough, said tube having a plurality of spaced metering valves along its length, each cooperating with a metering orifice defined by an aperture through a side wall of said fluid feed tube, wherein each of said metering valves includes a metering pin having one end adapted for operative metering engagement with said orifice and an opposite end extending through an opposite side wall of said fluid feed tube into a piston chamber; a piston fixed to said opposite end of said metering pin and adapted for movement within said piston chamber; spring means positioned within said chamber for operative engagement on a side opposite said metering pin for exerting a closing force on said metering to close said orifice; and pneumatic conduit means connected to said piston chamber on a side of piston opposite said spring means;
    pump means for pumping fluid through a supply conduit connected to one end of said fluid feed tube;
    reservoir means for supplying fluid to said pump, said reservoir having a return conduit connected to the other end of said fluid feed tube; and
    valve actuating means connected to said plurality of metering valves on said fluid feed tube and including pneumatic pump means for supplying pneumatic pressure to said conduit to supply a pneumatic pressure within said piston chamber to move said piston and metering pin against said spring means to open said orifices, said valve actuating means periodically actuating said valves as said plate passes under said fluid tube.

6. A fluid feed apparatus as defined in claim 5 including:
    a metering screw mounted in said spring side of said piston chamber for limiting movement of said piston and metering pin under urging from said pneumatic pressure.

7. A fluid feed apparatus as defined in claim 6 wherein said valve actuating means includes:
    means for providing periodically actuating pneumatic pressure through said conduit to periodically actuate said metering valves.

8. A fluid feed apparatus as defined in claim 7 wherein said periodically actuating means includes:
    means for periodically interrupting said pneumatic pressure.

9. A fluid feed apparatus as defined in claim 7 wherein said interrupting means includes:
    cam means for rotation in synchronism with movement of said plate under said fluid feed tube; and
    cam follower means for following said cam means and periodically producing a control signal in accordance therewith, said control signal being connected to said pneumatic pressure means for causing the periodic interruption of said pneumatic pressure generated thereby.

* * * * *